United States Patent
Kim

(10) Patent No.: US 12,401,172 B2
(45) Date of Patent: Aug. 26, 2025

(54) OPTICAL DEVICE CAPABLE OF PRECISE ADJUSTMENT OF OPTICAL OUTPUT INTENSITY, AND METHOD FOR MANUFACTURING OPTICAL DEVICE

(71) Applicant: Jeongsoo Kim, Sejong-si (KR)

(72) Inventor: Jeongsoo Kim, Sejong-si (KR)

( * ) Notice: Subject to any disclaimer, the term of this patent is extended or adjusted under 35 U.S.C. 154(b) by 1010 days.

(21) Appl. No.: 17/774,808

(22) PCT Filed: Mar. 21, 2019

(86) PCT No.: PCT/KR2019/003295
§ 371 (c)(1),
(2) Date: May 5, 2022

(87) PCT Pub. No.: WO2020/189829
PCT Pub. Date: Sep. 24, 2020

(65) Prior Publication Data
US 2022/0407286 A1    Dec. 22, 2022

(51) Int. Cl.
*H01S 5/00*   (2006.01)
*H01S 5/022*  (2021.01)
(Continued)

(52) U.S. Cl.
CPC ............ *H01S 5/0064* (2013.01); *H01S 5/022* (2013.01); *H01S 5/02326* (2021.01)

(58) Field of Classification Search
CPC .... H01S 5/0064; H01S 5/022; H01S 5/02326; H01S 5/02212; H01S 5/02251; H01S 5/02; G02B 6/42; H04B 10/50
See application file for complete search history.

(56) References Cited

U.S. PATENT DOCUMENTS 5,127,072 A * 6/1992 Blauvelt .............. G02B 6/4225
                                                385/88
6,275,317 B1 * 8/2001 Doerr ................... H04B 10/505
                                                398/201
(Continued)

FOREIGN PATENT DOCUMENTS

JP     H09-43460 A      2/1997
JP     2004-138864 A    5/2004
(Continued)

OTHER PUBLICATIONS

English Specification of JP2004-138864A.
(Continued)

*Primary Examiner* — Xinning(Tom) Niu
(74) *Attorney, Agent, or Firm* — ANTONIO HA & U.S. PATENT, LLC

(57) ABSTRACT

Disclosed are an optical device capable of precise adjustment of optical output intensity, and a method for manufacturing an optical device. An optical device including a laser diode, according to one aspect of the present embodiment, comprises: a laser diode for outputting light having a predetermined wavelength; an optical output unit in which output light of the laser diode is optically coupled and the output of the optical device takes place; and an optical isolator disposed between the laser diode and the optical output unit. The output light of the laser diode passes through the optical isolator and the output of the optical device takes place through the optical output unit, and the intensity of the output light of the optical device is determined by the rotation of the optical isolator.

9 Claims, 8 Drawing Sheets

(51) Int. Cl.
*H01S 5/02212* (2021.01)
*H01S 5/02326* (2021.01)

(56) References Cited

U.S. PATENT DOCUMENTS

| | | | | |
|---|---|---|---|---|
| 2001/0024270 | A1* | 9/2001 | Shirai | G01S 7/4812 |
| | | | | 356/3.04 |
| 2002/0181123 | A1* | 12/2002 | Han | G02B 19/0052 |
| | | | | 359/719 |
| 2004/0264888 | A1* | 12/2004 | Go | G02B 6/4206 |
| | | | | 385/92 |
| 2005/0135751 | A1 | 6/2005 | Zbinden | |
| 2009/0153949 | A1* | 6/2009 | Kanemoto | H04B 10/40 |
| | | | | 228/178 |
| 2013/0163629 | A1* | 6/2013 | Lee | G02B 6/3845 |
| | | | | 372/44.01 |

FOREIGN PATENT DOCUMENTS

| | | |
|---|---|---|
| KR | 10-2011-0021185 | 3/2011 |
| KR | 10-2019-0034034 | 4/2019 |

OTHER PUBLICATIONS

English Specification of JPH09-43460A.
English Specification of 10-2011-0021185.
English Specification of 10-2019-0034034.

* cited by examiner

• laser welding point (C)

(a)

(b)

• laser welding point (C)

• laser welding point (C)

• laser welding point (C)

OPTICAL DEVICE CAPABLE OF PRECISE ADJUSTMENT OF OPTICAL OUTPUT INTENSITY, AND METHOD FOR MANUFACTURING OPTICAL DEVICE

TECHNICAL FIELD

The present invention relates to an optical device capable of precisely adjusting the intensity of light output and a method for manufacturing the optical device.

BACKGROUND ART

The description of the Discussion of Related Art section merely provides information that may be relevant to embodiments of the disclosure but should not be appreciated as necessarily constituting the prior art.

NG-PON2 (or TWDM-PON), which is a standard communication scheme, is based on time wavelength division multiplexing (TWDM). In the NG-PON2 communication scheme based on TWDM, multiple subscribers may simultaneously connect to one optical fiber and may arbitrarily select any one allowed channel among four or eight wavelength channels. The plurality of subscribers using the same wavelength channel may share the optical fiber using a time division multiplexing (TDM) scheme that exchanges time only at predetermined times.

In the NG-PON2 communication standard, the light output ratio (extinction ratio or ER) of the signals '1s' and the signals '0s' of the optical device is defined as 6 dB, and the light output is 4 to 9 dBm. The light output ratio may be set to have different values. In this case, the value of the light output also changes to offset the change in the light output ratio.

More specifically, when the light output ratio of the light transmitter is decreased, the light reception sensitivity is lowered. Accordingly, when the light output ratio is decreased, the light output intensity should be increased. For example, when the light output ratio is set to 4.7 dB, which is lower than 6 dB, the light reception sensitivity may be reduced. To solve this problem, the value of the light output may be set to about 6.7 to 9 dBm, which is higher than 4 to 9 dEm.

The light output intensity allowed in the NG-PON2 communication scheme must meet all temperature and operating conditions. An optical subassembly (OSA) structure in which an optical device and an optical fiber are combined may include many mechanisms, which are affected by external environmental conditions, such as temperature. Accordingly, even when the intensity of light output from the semiconductor laser diode is constant, the intensity of light output from the optical fiber may be varied as the mechanism is affected by thermal expansion, thermal contraction, and external temperature change.

As such, the change in light output by external environmental conditions regardless of the light output of the semiconductor laser diode is called a tracking error. The smaller tracking error value means that the mechanism is less affected by the external environment and, in this case, the tracking error may have a value of ±0.5 dB. In other environments, the tracking error may have a value of ±1 dB. In the NG-PON2 communication scheme, the range of optical power that light is coupled the optical fiber may be expressed as light output, which may be 6.7 to 9 dBm. Since this value should be met in any environment, considering the tracking error value of ±1 dB or ±0.5 dB, the optical power of the optical device may have a value of 7.7 to 8.0 dBm or 7.2 to 8.5 dBm. When light is coupled to the optical fiber in the OSA structure, the loss of optical power is typically estimated to be around ±0.3 dB. In other words, when calculated by including both the tracking error value of ±0.5 dB and the optical power loss error value of ±0.3 dB due to the combination of light and optical fiber, the intensity of the light output has a value of about 7.5 to 8.2 dBm. In other words, the OSA structure should be manufactured according to these values. However, since the set range of the light output intensity is less than 1 dB, insufficient yield may occur during the manufacturing process.

OSA structures are mainly manufactured by laser welding. Since optical coupling efficiency in laser welding should maintain about 40 to 70%, it is difficult to adjust the optical coupling efficiency to be constant. This is why the diameter of the core of the optical fiber is very small, e.g., about 8 μm and, during laser welding, the metal components may be melted and coupled by high-power laser and, while cooled down, a twist may occur. Further, such twist irregularly occurs.

That the optical coupling efficiency in laser welding is 40 to 70% means that the optical coupling efficiency occurs irregularly within a range of about −1.5 to 4 dB. Since the change in optical coupling efficiency in laser welding is up to 2.5 dB, the intensity of the light output from the manufactured optical device may be varied by the change in optical coupling efficiency.

By adding 2.5 dB, which is the change in optical coupling efficiency due to irregularity of optical coupling efficiency during laser welding, 2 dB (±1 dB), which is the maximum tracking error value, and 0.6 dB (±0.3 dB), which is the irregular optical coupling loss occurring when the optical fiber is coupled to the OSA, the range of the light output intensity may be up to 5 dB. By such conditions, in the international NG-PON2 standard, the light output condition of the transmission OSA structure is specified as about 4 to 9 dBm.

When a laser diode, particularly DFB-LD, is used as a light source in the NG-PON2 communication scheme, the light output ratio of the DFB-LD may be set to about 6 dB. In this case, the transmission characteristics may be degraded due to the chirp which is a unique characteristic of the DFB-LD. The degradation of transmission quality due to chirp may be prevented by reducing the light output ratio from 6 dB to 4.7 dB. However, in such a case, the reception sensitivity at the reception end may be reduced. To compensate for the reduction in reception sensitivity at the reception end, the light output intensity of the OSA should be increased. However, if the light output intensity of the OSA rises up to 9 dBm or more, it may conflict with or be disturbed by optical signals in other schemes, and several side effects, such as four wave mixing, may occur. Therefore, the light output intensity of the OSA structure is limited to a maximum of 9 dBm.

If the light output ratio in the NG-PON2 communication scheme is set to be lower than 6 dB, the minimum optical power value increases, but the maximum value remains. If optical communication is performed using optical signals with a light output ratio of 4.7 dB, the light output intensity of the OSA structure at the light transmission end should be maintained as 6.7 to 9 dBm not to cause a reduction in reception sensitivity at the light reception end. It should be configured that the light output range when the light output intensity is 6.7 to 9 dBm is 2.3 dB, the error width when the OSA structure and the optical fiber are coupled is 0.6 dB, the tracking error value is 1 dB (±0.5 dB), and the optical coupling efficiency range in the process of coupling by, e.g., laser welding, is 0.7 dB or less. In particular, upon laser welding, the optical coupling efficiency should be precisely controlled to be 0.7 dB.

In other communication schemes than the NG-PON2 communication scheme, no significant limit is posed to the range of current injected to the laser diode. Accordingly, if the light output intensity when the laser diode is driven under a normal condition after the coupling process is lower than a target value, the current introduced into the laser diode chip is increased to increase the light output intensity of the laser diode chip itself. If the light output intensity is larger than the target value, the current flowing to the laser diode chip is reduced to adjust the light output intensity range.

The adjustment of the light output intensity of the laser diode chip itself by increasing/decreasing current is convenient, but such adjustment of light output intensity by increasing/decreasing current comes with the following issues. For example, in the NG-PON2 communication scheme using the DFB-LD, the laser diode chip itself has low-current characteristics. As such, if the light output of the laser diode chip is low, it is difficult to respond to high-rate signals of about 10 Gbps. If the intensity of the current flowing to the laser diode chip increases, the thermoelectric element, which maintains the light source at a constant wavelength in response to heat generation in the laser diode chip, may be thermally overburdened. Further, since the DFB-LD used as a light source in the NG-PON2 communication scheme has a very narrow current range, the low-current characteristics of the DFB-LD are not changed unlike optical communication elements in other schemes. Thus, if the user intends to perform communication in the NG-PON2 communication scheme using the DFB-LD, the optical coupling efficiency in the coupling process should be adjusted to a very narrow range.

Meanwhile, laser welding is performed so that the optical coupling efficiency range is 0.7 dB or less, considering several factors for the optical device. Such laser welding may not only complicate the manufacturing process of the optical device but also increase the manufacturing time. This results in a decrease in production yield.

DETAILED DESCRIPTION OF THE INVENTION

Technical Problems

An embodiment of the present invention aims to provide an optical device capable of precisely adjusting the light output intensity to be within a preset range by compensating for irregular errors in optical coupling efficiency caused in a coupling process and a method for manufacturing the optical device.

Further, according to the present invention aims to an optical device capable of precisely adjusting the light output intensity to be maintained within a preset range and a method for manufacturing the optical device.

Means to Address the Problems

According to an aspect of the present invention, there is provided an optical device, comprising a laser diode outputting a predetermined wavelength of light; an light output unit optically coupled with the light output from the laser diode to output the light from the optical device; and an optical isolator positioned between the laser diode and the light output unit, wherein the light output from the laser diode passes through the optical isolator and is output through the light output unit from the optical device, and wherein an intensity of the output light of the optical device is determined by rotation of the optical isolator.

According to an aspect of the present invention, the optical device further comprises a rotating plate. The optical isolator is coupled to one surface of the rotating plate, and wherein the optical isolator is rotated by rotation of the rotating plate.

According to an aspect of the present invention, the optical device further comprises a first housing and a second housing. The laser diode is coupled to the first housing. The light output unit is coupled to the second housing. If the first housing and the second housing are coupled to each other, a cavity, which is a predetermined space, is formed in a path along which the output light of the laser diode propagates to the light output unit. The optical isolator is positioned in the cavity.

According to an aspect of the present invention, the optical device further comprises a third housing between the first housing and the second housing.

According to an aspect of the present invention, the optical device further comprises a through hole on a side of one of the first to third housings, wherein the rotating plate is positioned to protrude in the through hole.

According to an aspect of the present invention, after the first housing and the second housing are coupled by a first coupling means, the rotating plate is rotated to set the output light of the optical device to a predetermined intensity, and then, the rotating plate is fixed by a second coupling means.

According to an aspect of the present invention, the first coupling means is any one of laser welding, electrical welding, or a high-molecular compound adhesive, and the second coupling means is any one of laser welding, electrical welding, or a high-molecular compound adhesive.

According to an aspect of the present invention, there is provided a method for manufacturing an optical device including a laser diode, comprising coupling the laser diode to a first housing; coupling a light output unit to a second housing; positioning a rotatable optical isolator between the first housing and the second housing and coupling the first housing with the second housing; setting an intensity of output light of the optical device by rotating the optical isolator; and fixing the optical isolator when the intensity of the output light is a predetermined intensity.

According to an aspect of the present invention, in the optical device including the laser diode, a beam output from the optical device is parallel light. The parallel light passes through the optical isolator and is focused by a lens disposed before the light output unit to the light output unit and is output.

According to an aspect of the present invention, the third housing further includes a 45-degree inclined filter transmitting the light output from the laser diode and passing through the optical isolator and reflecting light input to the light output unit and propagating to the third housing.

According to an aspect of the present invention, the light output from the laser diode is parallel light, and wherein the parallel light passes through the optical isolator and the 45-degree inclined filter and is focused by a lens disposed before the light output unit to the light output unit and is output.

According to an aspect of the present invention, a light reception element is provided in the third housing.

Effects of the Invention

As described above, according to an embodiment of the present invention, it is advantageously possible to manufacture an optical device having a desired light output by adjusting the light output intensity according to a change in optical coupling efficiency, which may occur during a manufacturing process, mechanically, but not by current.

According to an embodiment of the present invention, it is possible to compensate for an error in light output intensity caused during a manufacturing process. Thus, it is possible to shorten the processing time and increase the yield.

Further, according to an embodiment of the present invention, it is possible to allow for application to various specifications and types because the light output intensity is mechanically adjusted.

MODE TO PRACTICE THE INVENTION

Various changes may be made to the present invention, and the present invention may come with a diversity of embodiments. Some embodiments of the present invention are shown and described in connection with the drawings. However, it should be appreciated that the present disclosure is not limited to the embodiments, and all changes and/or equivalents or replacements thereto also belong to the scope of the present disclosure. Similar reference denotations are used to refer to similar elements throughout the drawings.

The terms "first" and "second" may be used to describe various components, but the components should not be limited by the terms. The terms are used to distinguish one component from another. For example, a first component may be denoted a second component, and vice versa without departing from the scope of the present disclosure. The term "and/or" may denote a combination(s) of a plurality of related items as listed or any of the items.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when a component is "directly connected to" or "directly coupled to" another component, no other intervening components may intervene therebetween.

The terms as used herein are provided merely to describe some embodiments thereof, but not to limit the present disclosure. As used herein, the singular forms "a," "an," and "the" are intended to include the plural forms as well, unless the context clearly indicates otherwise. As used herein, the term "comprise," "include," or "have" should be appreciated not to preclude the presence or addability of features, numbers, steps, operations, components, parts, or combinations thereof as set forth herein.

Unless otherwise defined, all terms including technical and scientific terms used herein have the same meaning as commonly understood by one of ordinary skill in the art to which the embodiments of the present disclosure belong.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The components, processes, steps, or methods according to embodiments of the disclosure may be shared as long as they do not technically conflict with each other.

Figure 1:
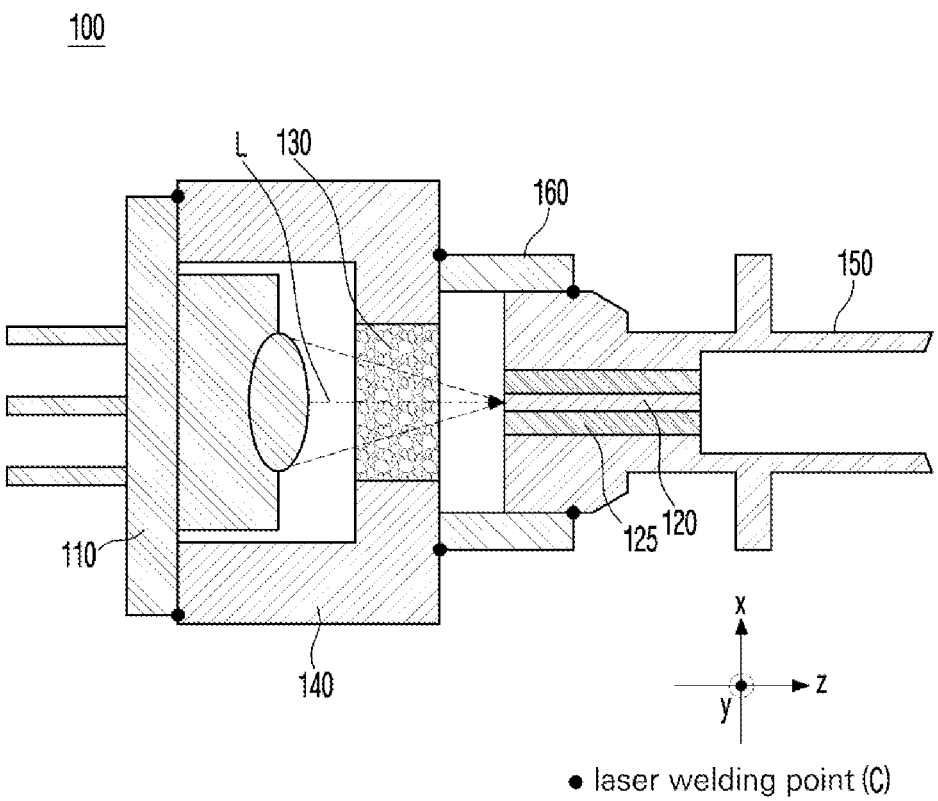
FIG. 1 is a side cross-sectional view illustrating a TOSA including a TO-CAN-type laser diode which is a kind of optical device according to an embodiment of the present invention.

FIG. 1 is a side cross-sectional view illustrating a TOSA including a TO-CAN-type laser diode which is a kind of optical device according to an embodiment of the present invention.

Referring to FIG. 1, a TOSA 100 includes a laser diode 110, an optical fiber 120, an optical isolator 130, a first housing 140, a second housing 150, and a third housing 160.

An optical device in the form of the transmitter optical sub assembly (TOSA) 100 is configured in a form in which a receptacle (not shown) of the optical fiber 120 and a TO can-type laser diode 110 are optically coupled.

The laser diode 110 emits light L toward the optical fiber 120. The laser diode 110 may be of a TO can type. The laser diode 110 may be configured to be coupled to the first housing 140.

Since the optical fiber 120 is formed of glass, the optical fiber 120 is not easy to couple with other components. Accordingly, the optical fiber 120 may be configured to be surrounded by a ferrule 125 and, in this case, the ferrule 125 may be configured in a form surrounded by the second housing 150. Here, the ferrule 125 may be formed of zirconia, but is not limited thereto.

The optical fiber 120 is a component of an output terminal outputting the light L, and the light L is output to the outside along a core (not shown). However, in the TOSA 100 structure, the output terminal for outputting light L is not limited to the optical fiber 120 and may be replaced with other components, e.g., a lens, depending on applications. Since the diameter of the core (not shown) of the optical fiber 120 is very small, e.g., about 8 μm, the position of the light L emitted from the TO can-type laser diode 110 needs to be very precisely adjusted so that effective optical coupling may be achieved.

In optical communication, the laser diode 110 is disturbed by the light (not shown) incident on the laser diode 110 from the optical fiber 120. The optical isolator 130 transmits the light L incident from the laser diode 110 to the optical fiber 120 and blocks the light (not shown) incident from the optical fiber 120 to the laser diode 110.

The first housing 140 is connected to the laser diode 110 and may be formed of stainless steel (SUS), but is not limited thereto.

The second housing 150 is connected to the optical fiber 120 and the ferrule 125 and, like the first housing 140, the second housing 150 may be formed of stainless steel (SUS), but is not limited thereto.

The first housing 140 and the second housing 150 are coupled by a third housing 160.

The third housing 160 may be configured integrally with the first housing 140 or the second housing 150 or may be configured to be separated from the first housing 140 or the second housing 150. According to an embodiment of the present invention, in the TOSA 100 structure, the three housings 140, 150, and 160 are shown as being detachably coupled, but the structure may include two housings or three or more housings.

A process for manufacturing the TOSA 100 is as follows. The TO can-type laser diode 110 is coupled to the first housing 140. If the optical isolator 130 is inserted between the first housing 140 and the second housing 150, the first to third housings 140, 150, and 160 holding the TO can-type laser diode 110 are coupled. More specifically, the third housing 160 is disposed between the first housing 140 and the second housing 150, and in this case, welding is performed at a welding point C by a laser so that the first to third housings 140, 150, and 150 are coupled together. The method for coupling the first to third housings 140, 150, and 160 is not limited to laser welding, but the first to third housings 140, 150, and 160 may also be coupled by electric welding or an adhesive, such as epoxy.

If the first to third housings 140, 150, and 160 are welded by a laser, the metal components constituting the first to third housings 140, 150, and 160 may be melted by the laser and, while cooled down, they are coupled together. In this process, the relative positions of the TO can-type laser diode 110 and the optical fiber 120, which used to be precisely aligned, may be displaced. If the relative positions are displaced, the path of the light L is changed so that the final light output from the optical fiber 120 is varied. Accordingly, the optical coupling efficiency is also changed. Since the degree of twist of the relative position cannot be predicted, it is difficult to precisely control the intensity of the final light output from the optical fiber 120. In other words, unless the intensity of the light output is monitored in real time, it is almost impossible to reduce the error in the optical coupling efficiency generated in the coupling process.

In particular, as mentioned in the Background art section, the width of adjusting the driving current may be limited due to such characteristics as high-rate communication depending on applications. In this case, it is more difficult to adjust the light output from the TOSA 100 to a very narrow area.

Figure 2:
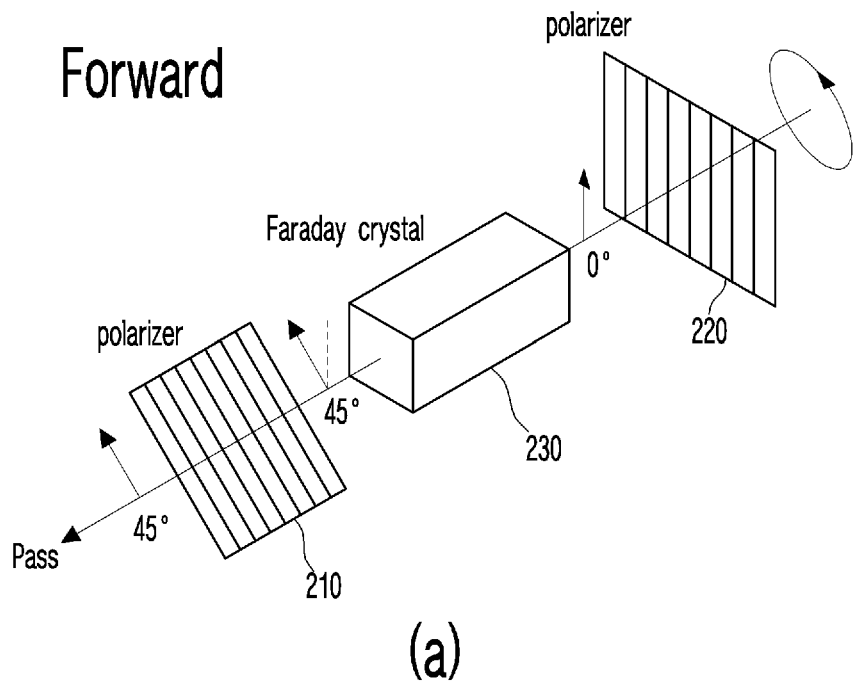
FIG. 2 is a view illustrating operations of an optical isolator according to an embodiment of the present invention.
Figure 2:
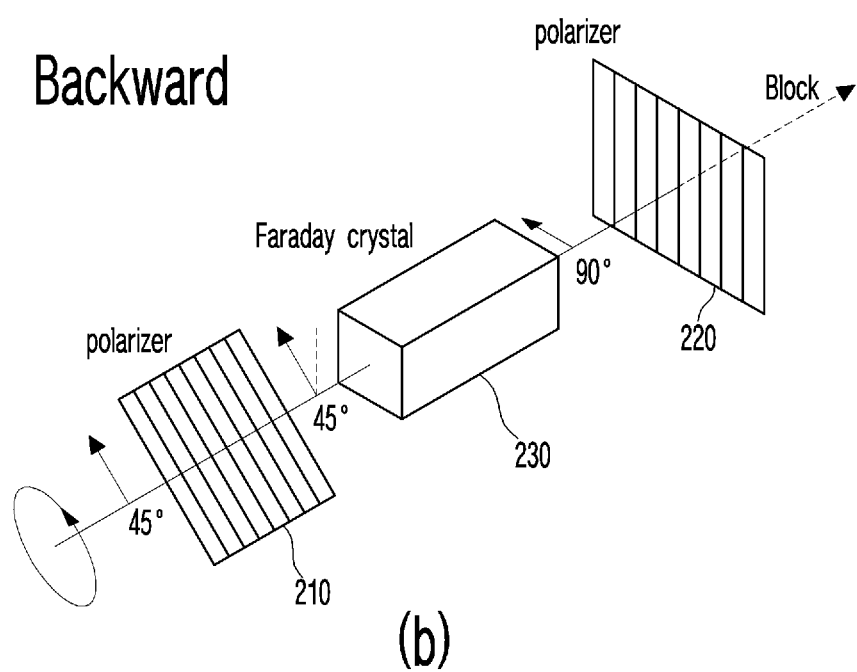

FIG. 2 is a view illustrating operations of an optical isolator according to an embodiment of the present invention.

referring to FIG. 2, the optical isolator 130 includes two polarizers 210 and 220 that cross the directions of transmitted polarized light rays at 45° and a Faraday rotator 230 that changes the polarization of the laser beam L to a 45-degree direction.

As shown in FIG. 2(a), the optical isolator 130 transmits the light L emitted from the laser diode 110 to the optical fiber 120. The first polarizer 210 transmits the light L, and the Faraday rotator 230 rotates the polarization of the light L by 45°. The second polarizer 220 forms the polarization of light L in the same direction as that of the second polarizer 220. As such, the optical isolator 130 transmits the light L to enter the optical fiber 120.

Meanwhile, as shown in FIG. 2(b), the optical isolator 130 blocks the light L' emitted from the optical fiber 120 to the laser diode 110. The light L' emitted to the laser diode 110 is unpolarized. In other words, the first polarizer 210 transmits the light L' polarized at 45°, and the transmitted light L' is polarized in a direction perpendicular to the second polarizer 220 by the Faraday rotator 230. Accordingly, the polarized light L' transmitted through the first polarizer 210 passes through the Faraday rotator 230 and is blocked by the second polarizer 220.

When the light L is emitted to the optical fiber 120 (that is, the direction in which the light L is transmitted), insertion loss occurs in the first polarizer 210 depending on the polarization of the laser beam L and the polarization direction of the first polarizer 210. To solve this problem, when manufacturing the TOSA 100, the manufacturer marks the polarization directions of the first and second polarizers 210 and 220 to the first and second polarizers 210 and 220 of the optical isolator 130 so that the polarization direction of the optical isolator 130 is identical to the polarization direction of the laser beam L emitted from the laser diode 110. This is described below with reference to FIG. 3.

Figure 3:
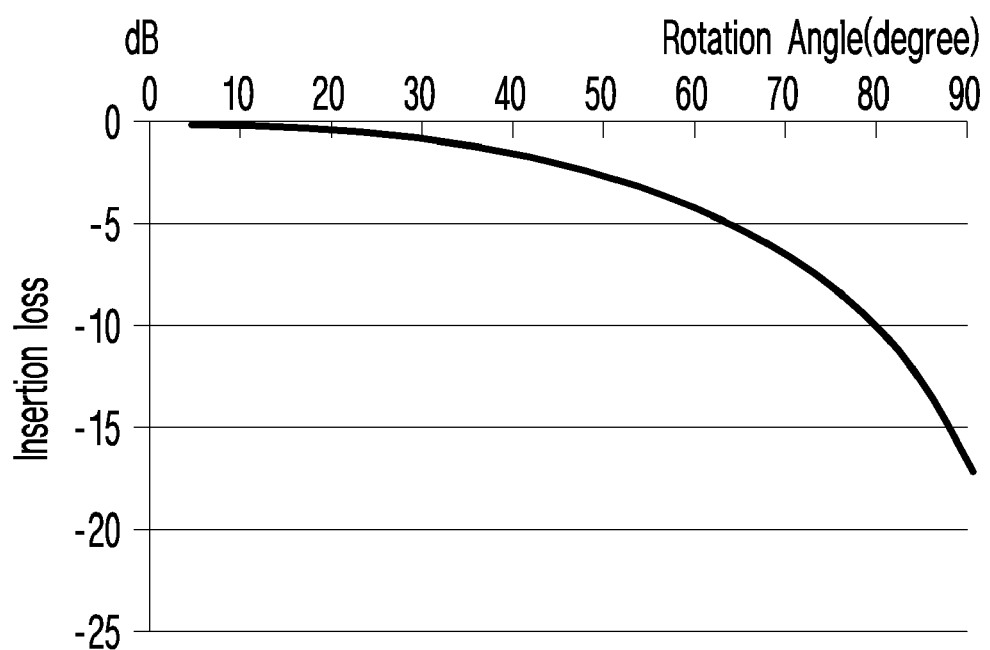
FIG. 3 is a view illustrating insertion loss according to the angle of incident light of an optical isolator according to an embodiment of the present invention.

FIG. 3 is a view illustrating insertion loss according to the angle of incident light of an optical isolator according to an embodiment of the present invention.

Referring to FIG. 3, it may be identified that for the laser beam L propagating in the direction of passing through the optical isolator 130, the insertion loss caused in the optical isolator 130 depending on the relative angle between the polarization direction of the laser beam L and the polarization direction of the optical isolator 130 is measured in decibel (dB). Although the laser beam L propagates in the direction of passing through the optical isolator 130, the insertion loss in the optical isolator 130 may be varied depending on the relative angle between the polarization direction of the laser beam L and the polarization direction of the optical isolator 130 and, in this case, the insertion loss may occur from 0 dB to 30 dB or more.

Figure 4:
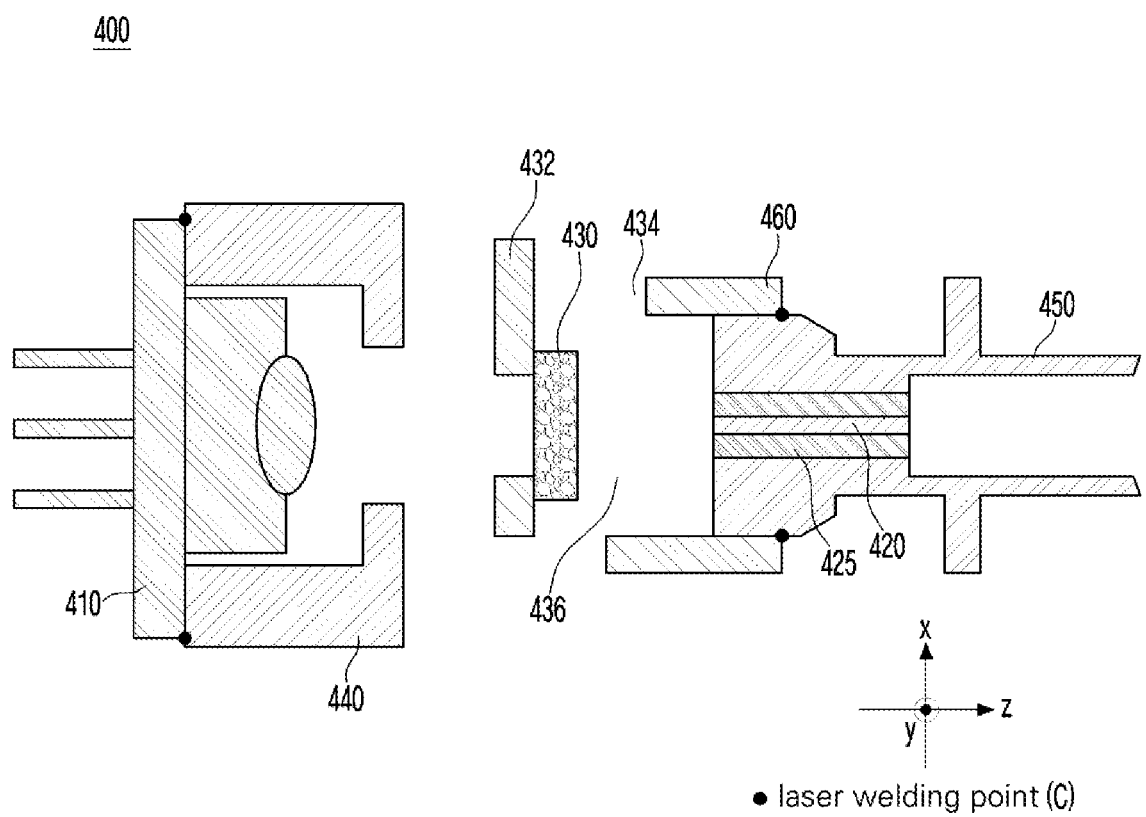
FIG. 4 is a view illustrating a process of assembling a TOSA according to another embodiment of the present invention.
Figure 5:
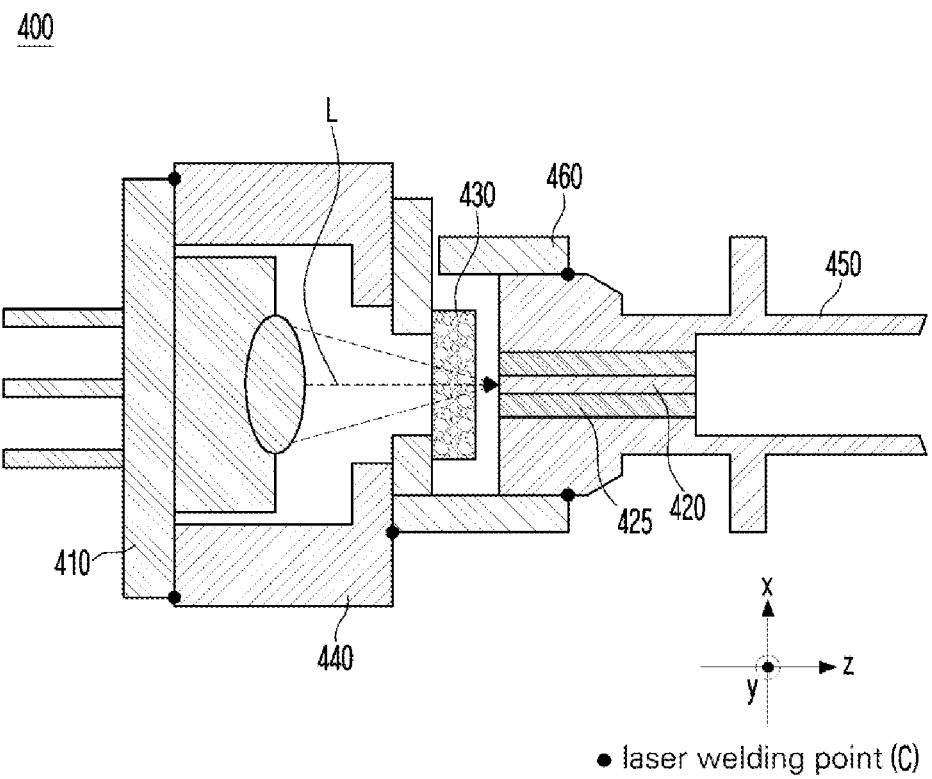
FIG. 5 is a view illustrating a process of coupling a TOSA according to another embodiment of the present invention.

FIG. 4 is a view illustrating a process for assembling a TOSA according to another embodiment of the present invention. FIG. 5 is a view illustrating a process of coupling a TOSA according to another embodiment of the present invention.

A TOSA 400 includes a first housing 440 coupled with a TO can-type laser diode 410, a second housing 450 including an optical fiber 420, a third housing 460 coupled to the second housing 450, a rotating plate 432 positioned between the third housing 460 and the first housing 440, and an optical isolator 430 disposed on one surface of the rotating plate 432.

Referring to FIG. 4, in the process of assembling the TOSA 400, the TO can-type laser diode 410, the first housing 440, the second housing 450, and the third housing 460 are coupled together by laser welding. Although FIG. 4 illustrates three housings 440, 450, and 460, the present invention is not limited thereto, but three or more or less housings may be included. Coupling the first to third housings 440, 450, and 460 is not limited to laser welding, but the first to third housings 440, 450, and 460 may also be coupled by electric welding or an adhesive, such as epoxy.

Referring to FIG. 5, the laser diode 410, the first housing 440, the second housing 450, and the third housing 460 are coupled together by laser welding. In a cavity 436 present between the first housing 440 and the third housing 460, i.e., in the path along which light L emitted from the laser diode 410 passes to couple to the optical fiber 420, the rotating plate 432 including the optical isolator 430 is positioned. If the rotating plate 432 including the optical isolator 430 is positioned in the cavity 436, a welding point C is welded by laser.

Here, the rotating plate 432 is inserted into the cavity 436 and may thus be disposed and assembled, stuck between the first housing 440 and the third housing 460. The rotating plate 432 is disposed to be rotatable between the first housing 440 and the third housing 460, rather than permanently fixed by welding, although the first housing 440 and the third housing 460 are coupled by laser welding.

The first housing 440 and/or the third housing 460 may further include a guide (not shown) for guiding the rotating plate 432 on one surface thereof, so that the rotating plate 432 stuck between the first housing 440 and the third housing 460 may easily be rotated in a state in which the first housing 440 and the third housing 460 are coupled together by laser welding. If the rotating plate 432 positioned to contact the first housing 440 has a circular shape, the guide (not shown) may be configured in a circular shape with an area larger than the circular shape of the rotating plate 432. The shapes of the rotating plate 432 and the guide (not shown) are not limited to the circular shape but may be configured in other various shapes than the circular shape. In particular, to identify the rotation angle of the rotating plate 432, the rotating plate 432 may be implemented in a shape having a gear wheel.

A through hole 434 may be provided on one side of the third housing 460 to allow the rotating plate 432 to be rotated. The rotating plate 432 may be configured to be partially exposed from the through hole 434 and may thus be rotated.

The optical isolator 430 is coupled to one surface of the rotating plate 432, and a hole may be formed between the optical isolator 430 and the rotating plate 432 to allow the light L output from the laser diode 410 to pass through the optical isolator 430.

In the so assembled optical module 400, the relative positions of the TO can-type laser diode 410 and the optical fiber 420 are fixed by laser welding, but the optical isolator 430 may be rotated by the rotating plate 432. Hence, deformation, such as shrinkage caused by laser welding, is determined at the time when the laser welding ends, and after a time elapses, no more deformation occurs.

In the so manufactured optical module 400, as a current with a preset value is applied to the laser diode 410, light is emitted. In this case, if the intensity of the light output from the optical fiber 420 differs from a preset value, the rotating plate 432 is rotated to be able to rotate the optical isolator 430. In other words, it is possible to allow the intensity of the light output from the optical fiber 420 to be identical to the preset value by adjusting the angle of the optical isolator 430. If the rotating plate 432 including the optical isolator 430 is fixed to the first housing 440 and/or the third housing 460 by an adhesive, e.g., epoxy, the angle of the optical isolator 430 is finally fixed. The angle of the optical isolator 430 means the angle at which the optical isolator 430 rotates about the Z axis on the X-Y plane.

The rotating plate 432 rotates about the Z axis on the X-Y plane. This is why the internal structure (i.e., the cavity 436) of the optical device 400 is very narrow. However, the rotation of the rotating plate 432 includes the vector that rotates about the Z axis on the X-Y plane. In other words, the rotation of the optical isolator 430 by the rotation of the rotating plate 432 is rotation about the optical axis of the light incident on the optical isolator 430. In other words, the rotating plate 432 is rotated on a plane parallel to the surface of the optical isolator 430 on which the light is incident.

The optical module 400 may compensate for the variation in light output caused as the plurality of housings 440, 450, and 460 are welded by laser. Since the optical module 400 compensating for the variation in light output precisely controls the output, the optical module 400 may advantageously meet output requirements for various systems requiring precise output. Further, as the intensity of light is calibrated by rotating the rotating plate 432 after manufacture, the product yield may be significantly increased. Further, since optical coupling efficiency is not precisely controlled upon laser welding, it is possible to shorten the time required to manufacture one optical module. Although the present invention includes the step of adjusting the rotating plate 432 while identifying the output of the laser, this step is conventionally included in the step of identifying the quality of the laser manufactured, and thus, the added process in the present invention may further reduce the time as compared with conventionally performing laser welding precisely by the worker.

Figure 6:
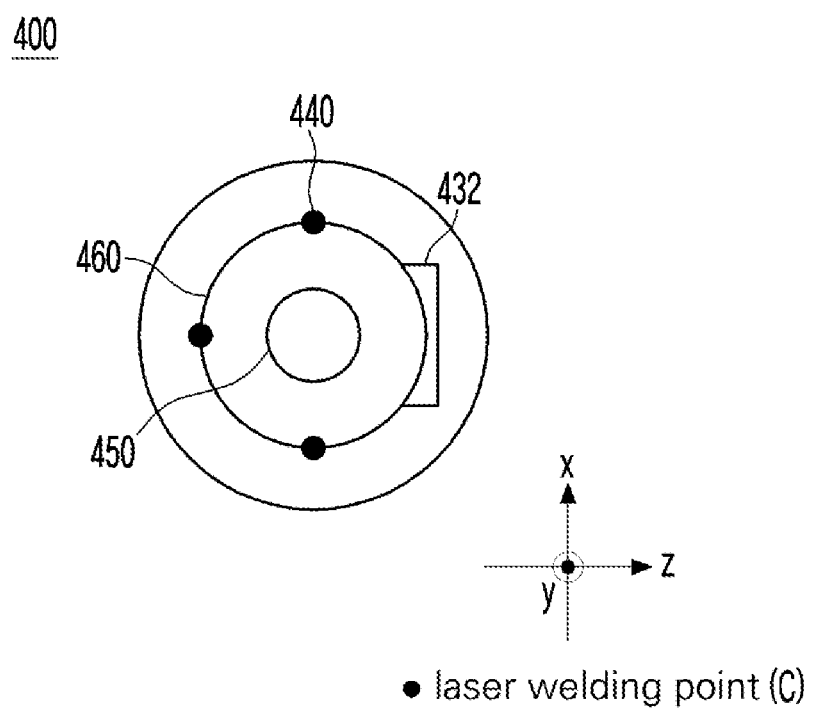
FIG. 6 is a cross-sectional view of the TOSA as viewed in the Z axis of FIG. 5.

FIG. 6 is a cross-sectional view of the TOSA as viewed in the Z axis of FIG. 5.

Referring to FIG. 6, the rotating plate 432 is exposed to a side of the through hole 434 and is rotated on the X-Y plane. The rotating plate 432 rotates clockwise or counter-clockwise and, as the rotating plate 432 rotates, the light output is varied. Although three laser welding points C are shown, the number of welding points C may be more or less than three as long as it does not affect the rotation of the rotating plate 432.

According to another embodiment of the present invention, although the optical module 400 implements the technical scope of the present invention by way of rotation of the optical isolator 430, if the optical device implements similar functions by including a polarizer and a Faraday rotator, it may also be included in an equivalent scope.

The light L output from the laser diode 410 may be parallel light, and the light l may pass through the optical isolator 430 and then a lens (not shown) to the light output unit and may then be output.

Although, in the one embodiment and the other embodiment of the present invention, the description focuses on the structures of the TOSAs 100 and 400 only including the laser diodes 110 and 410, the optical modules 100 and 400 may include an additional optical device, such as a photodiode, in addition to the laser diodes 110 and 410. As an example of such configuration, a BOSA structure is described.

The present invention is very effective when applied to such a communication standard as NG-PON2 which requires that the light output intensity be adjusted in a very narrow area. In the NG-PON2 communication scheme, the upstream light waveguide band is 1532 nm, and the downstream light wavelength band is 1596 nm. In the NG-PON2 communication scheme, transmission and reception of optical signals may simultaneously be performed with one optical module. A bi-directional optical module for NG-PON2 is described with reference to FIGS. 7 and 8.

Figure 7:
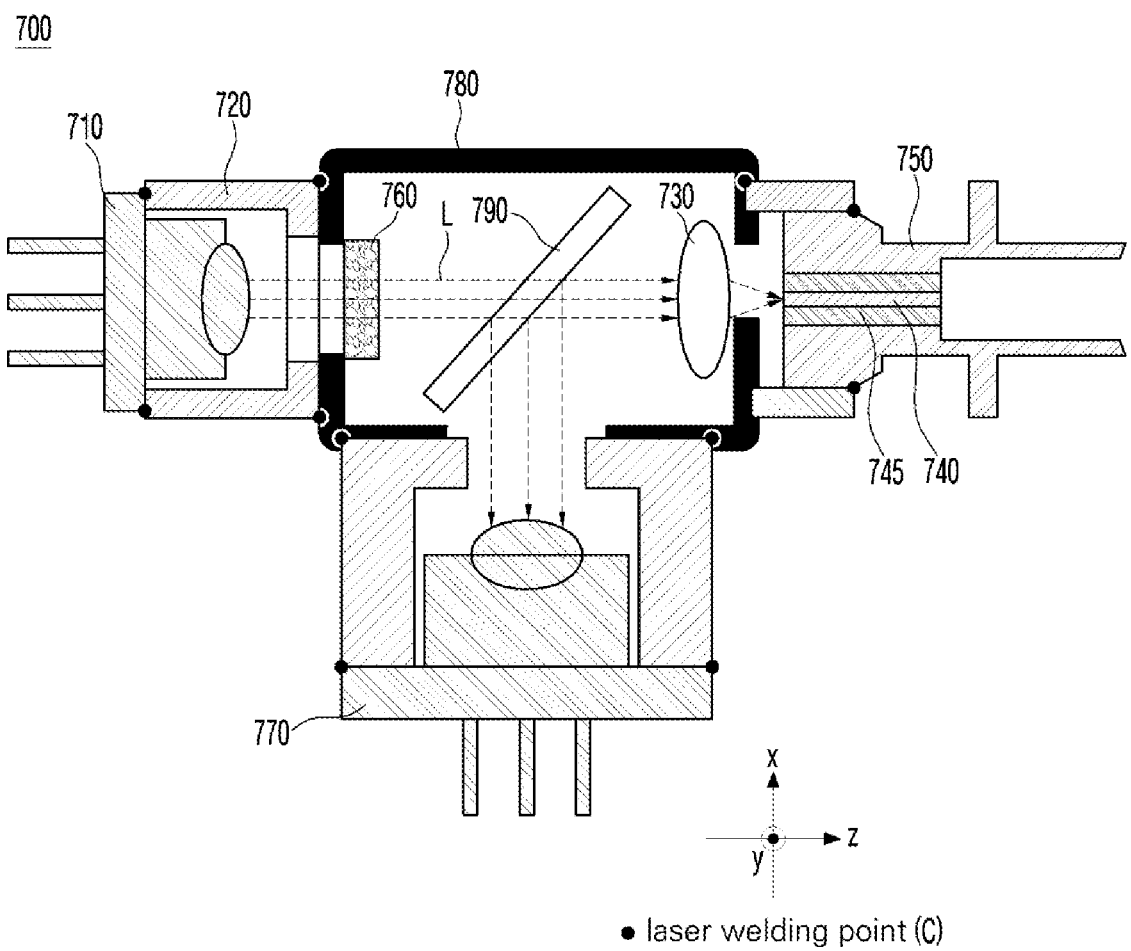
FIG. 7 is a view illustrating a BOSA which is a conventional bi-directional optical module.

FIG. 7 is a view illustrating a BOSA which is a conventional bi-directional optical module.

Referring to FIG. 7, in a bi-directional optical sub assembly (BOSA) 700, which is a bi-directional optical module, a light transmission element may be implemented as a TO can-type transmitter 710, and a light reception element (or receiver) 770 may be implemented as a TO can-type device. The transmitter 710 may be configured as a mini flat-type package or a butterfly-type package. The parallel light L output from the transmitter 710 passes through an optical isolator 760 and a beam splitter 790, which is rotated at 45°, and is then focused through a lens 730 to an optical fiber 740. More specifically, the signal output from the optical fiber 740 is converted into parallel light (not shown) through the lens 730 disposed at the tip of the optical fiber 740 and is then reflected by the beam splitter 790, which is rotated at 45°, and enters the light reception element 770. The light reception element 770 receives the optical signal. Here, the parallel light (not shown) may be replaced by converging light or diverging light.

Conventionally, an optical isolator 760 is inserted between the transmitter 710 and the 45-degree beam splitter 790 to remove the optical signal that is transmitted through the 45-degree rotated beam splitter 790 to the transmitter 710 when the optical signal is transmitted through the optical fiber 740 to the BOSA 700 for bi-directional communication. The optical isolator 760 may be fixed to a transmitter SUS part 720 connected with the transmitter 710 or a BOSA body SUS part 780, and the transmitter SUS part 720 including the transmitter 710 and the BOSA body SUS part 780 are coupled to each other by laser welding. In the BOSA 700 according to such conventional manufacturing method, the optical isolator 760 is fixed to the BOSA body SUS part 780 or the transmitter SUS part 720, so that the optical isolator 760 cannot be rotated.

Further, in the conventional BOSA 700, the transmitter SUS part 720 and the BOSA body SUS part 780 are fixed by laser welding, so that the optical fiber SUS part 750 including the optical fiber 740 is optically aligned with the laser of the transmitter 710, and the optical fiber SUS part 750 is welded with the BOSA body SUS part 780 by laser welding. Accordingly, it was conventionally difficult to prevent a variation in the optical coupling efficiency of the optical module 700 which may occur due to, e.g., shrinkage after laser welding, and the intensity of the light output to the optical fiber 740 was not constantly adjusted in response to preset driving power for the transmitter 710.

Figure 8:
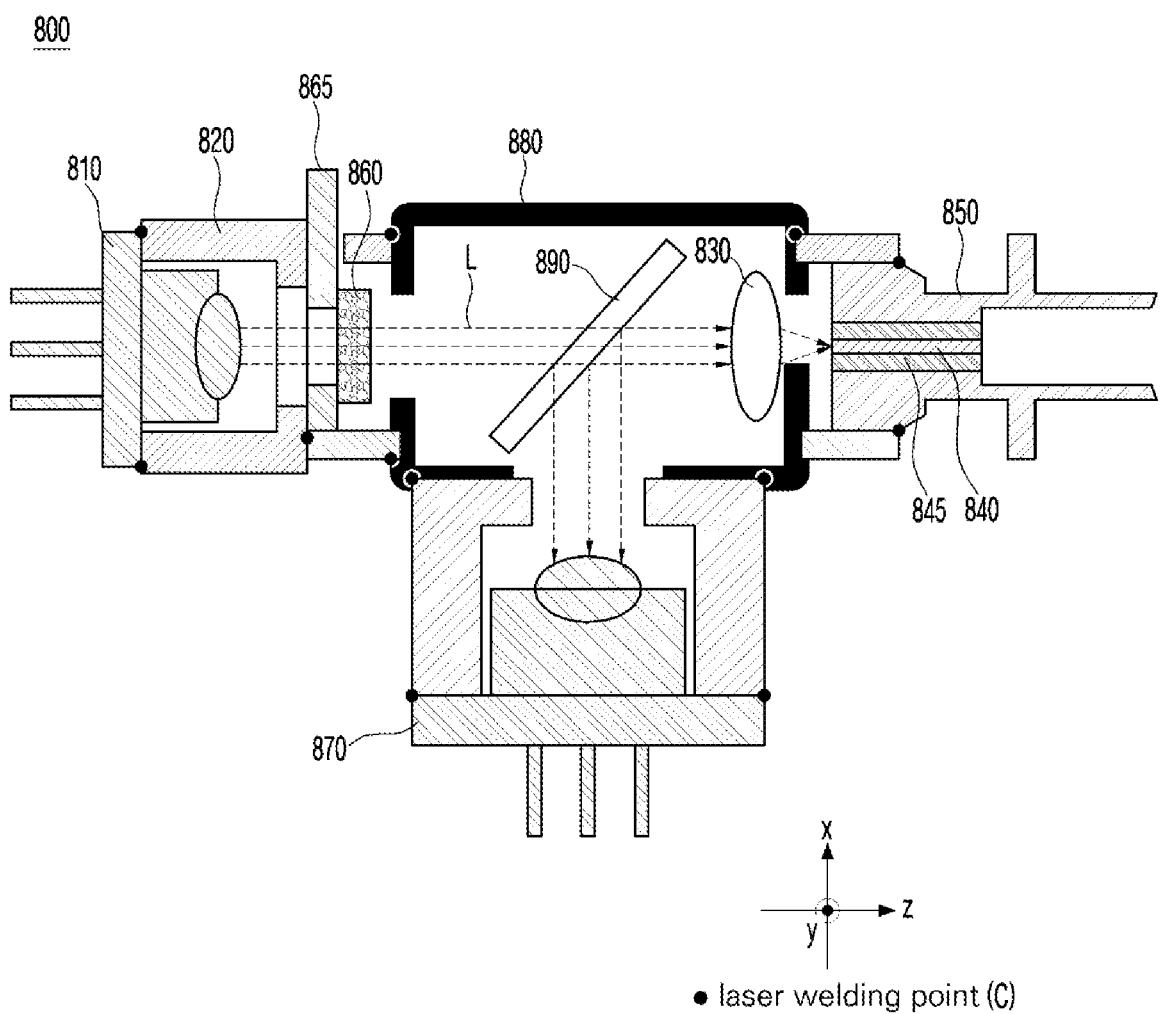
FIG. 8 is a view illustrating a BOSA which is a bi-directional optical module according to an embodiment of the present invention.

FIG. 8 is a view illustrating a BOSA which is a bi-directional optical module according to an embodiment of the present invention.

Referring to FIG. 8, an optical isolator 860 is coupled to an upper surface of a rotatable rotating plate 865 and is then inserted between a transmitter SUS part 820 and a BOSA body SUS part 880. As the transmitter SUS part 820 and the BOSA body SUS part 880 are coupled by laser welding, the optical isolator 860 is fixed to the transmitter SUS part 820. The rotating plate 865 to which the optical isolator 860 is attached is positioned between the transmitter SUS part 820 and the BOSA body SUS part 880 and, as not fixed by laser welding, the rotating plate 860 is rotatable.

After the transmitter SUS part 820 and the BOSA body SUS part 880 are coupled and fixed by laser welding, the optical fiber SUS part 850 is optically aligned by the laser output from the transmitter 810, and the BOSA body SUS part 880 and the optical fiber SUS part 850 are fixed by laser welding. The optical coupling efficiency when the optical fiber SUS part 850 is optically aligned again after welded by laser may be significantly different from the optical coupling efficiency before laser welding. Such change in optical coupling efficiency after laser welding may be offset by rotating the optical isolator 860-attached rotating plate 865 to thereby adjust the light output intensity.

If the optical coupling efficiency of the transmitter 810 and the optical fiber 840 is precisely adjusted by the rotation of the optical isolator 860, the optical isolator 860-attached rotating plate 865 is fixed to the transmitter SUS part 820 or the BOSA body SUS part 880 by epoxy or glue. Accordingly, it is possible to prevent the optical isolator 860 from rotating due to, e.g., vibration.

According to an embodiment of the present invention, coupling between the SUS part (or housing) and the SUS part (or housing) is not limited by laser welding and may also be performed by, e.g., electrical welding or an adhesive, such as epoxy.

The above-described embodiments are merely examples, and it will be appreciated by one of ordinary skill in the art various changes may be made thereto without departing from the scope of the present invention. Accordingly, the embodiments set forth herein are provided for illustrative purposes, but not to limit the scope of the present invention, and should be appreciated that the scope of the present invention is not limited by the embodiments. The scope of the present invention should be construed by the following claims, and all technical spirits within equivalents thereof should be interpreted to belong to the scope of the present invention.

CROSS-REFERENCE TO RELATED APPLICATION

The instant patent application claims priority under 35 U.S.C. 119(a) to Korean Patent Application No. 10-2017-0122903, filed on Sep. 22, 2017, in the Korean Intellectual Property Office, the disclosure of which is herein incorporated by reference in its entirety. The present patent application claims priority to other applications to be filed in other countries, the disclosures of which are also incorporated by reference herein in their entireties.

The invention claimed is:

1. An optical device, comprising:
a laser diode outputting a predetermined wavelength of light;
a first housing coupled to the laser diode;
a third housing coupled to the first housing and including a through hole on a side of the third housing;
a cavity presenting between the first housing and the third housing in the path along which light emitted from the laser diode passes;
a light output unit optically coupled with the light output from the laser diode to output the light from the optical device; and
a rotating plate positioned in the cavity, partially exposed to the outside of the third housing through the through hole to allow rotation after laser welding thereby being rotatably stuck between the first housing and the third housing, and including an optical isolator,
wherein the rotating plate is rotated so that the intensity of the output light becomes a predetermined intensity when a current with a preset value is applied to the laser diode after the laser welding.

2. The optical device of claim 1, further comprising a rotating plate, wherein the optical isolator is coupled to one surface of the rotating plate, and wherein the optical isolator is rotated by rotation of the rotating plate.

3. The optical device of claim 1, wherein after the first housing and the second housing are coupled by a first coupling means, the rotating plate is rotated to set the output light of the optical device to a predetermined intensity, and then, the rotating plate is fixed by a second coupling means.

4. The optical device of claim 3, wherein the first coupling means is any one of laser welding, electrical welding, or a high-molecular compound adhesive, and wherein the second coupling means is any one of laser welding, electrical welding, or a high-molecular compound adhesive.

5. A method for manufacturing an optical device including a laser diode, the method comprising:
coupling the laser diode to a first housing;
coupling a third housing including a through hole on a side of the third housing to the first housing;
positioning a rotating plate in a cavity presenting between the first housing and the third housing to allow rotation in such a way that the rotating plate is stuck between the first housing and the third housing;
setting an intensity of output light of the optical device by rotating the rotating plate; and
fixing the rotating plate when the intensity of the output light is a predetermined intensity
wherein the rotating plate includes an optical isolator and the rotating plate is partially exposed to the outside of the third housing through the through hole to allow rotation after laser welding.

6. The optical device of claim 1, wherein a beam output from the optical device is parallel light, and wherein the parallel light passes through the optical isolator and is focused by a lens disposed before the light output unit to the light output unit and is output.

7. The optical device of claim 1, wherein the third housing further includes a 45-degree inclined filter transmitting the light output from the laser diode and passing through the optical isolator and reflecting light input to the light output unit and propagating to the third housing.

8. The optical device of claim 7, wherein the light output from the laser diode is parallel light, and wherein the parallel light passes through the optical isolator and the 45-degree inclined filter and is focused by a lens disposed before the light output unit to the light output unit and is output.

9. The optical device of claim 1, wherein a light reception element is provided in the third housing.

* * * * *